United States Patent
Chiang et al.

(10) Patent No.: US 7,902,064 B1
(45) Date of Patent: Mar. 8, 2011

(54) METHOD OF FORMING A LAYER TO ENHANCE ALD NUCLEATION ON A SUBSTRATE

(75) Inventors: Tony Chiang, Campbell, CA (US); Chi-I Lang, Sunnyvale, CA (US); Zachary Fresco, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 350 days.

(21) Appl. No.: 12/121,661

(22) Filed: May 15, 2008

Related U.S. Application Data

(60) Provisional application No. 60/938,431, filed on May 16, 2007.

(51) Int. Cl.
*H01L 21/4763* (2006.01)

(52) U.S. Cl. .......... 438/627; 257/751; 257/E23.165

(58) Field of Classification Search .......... 257/751, 257/738, 758, 759, 635, E23.165; 438/627, 438/638, 653
See application file for complete search history.

(56) References Cited

U.S. PATENT DOCUMENTS

| | | | |
|---|---|---|---|
| 6,416,822 B1 | 7/2002 | Chiang | |
| 6,428,859 B1 | 8/2002 | Chiang | |
| 6,569,501 B2 | 5/2003 | Chiang | |
| 6,580,169 B2 * | 6/2003 | Sakuyama et al. | 257/738 |
| 6,630,201 B2 | 10/2003 | Chiang | |
| 6,641,899 B1 | 11/2003 | Colburn | |
| 6,800,173 B2 | 10/2004 | Chiang | |
| 6,878,402 B2 | 4/2005 | Chiang | |
| 6,919,636 B1 * | 7/2005 | Ryan | 257/751 |
| 6,949,450 B2 | 9/2005 | Chiang | |
| 7,138,333 B2 * | 11/2006 | Schmidt et al. | 438/627 |
| 7,138,703 B2 * | 11/2006 | Maida et al. | 257/635 |
| 7,189,432 B2 | 3/2007 | Chiang | |
| 7,309,658 B2 | 12/2007 | Lazovsky | |
| 7,390,739 B2 | 6/2008 | Lazovsky | |
| 7,728,436 B2 * | 6/2010 | Whelan et al. | 257/759 |
| 2004/0074518 A1 * | 4/2004 | Korthuis et al. | 134/1.3 |
| 2006/0030148 A1 * | 2/2006 | Seutter et al. | 438/653 |
| 2006/0060301 A1 * | 3/2006 | Lazovsky et al. | 156/345.26 |
| 2006/0128142 A1 * | 6/2006 | Whelan et al. | 438/638 |
| 2006/0264020 A1 | 11/2006 | Lazovsky | |
| 2007/0077272 A1 * | 4/2007 | Li et al. | 424/423 |
| 2007/0278682 A1 * | 12/2007 | Ko et al. | 257/758 |
| 2008/0246150 A1 * | 10/2008 | Lazovsky et al. | 257/751 |
| 2009/0014846 A1 | 1/2009 | Fresco | |

OTHER PUBLICATIONS

Coupe et al., A New Approach to Surface Functionalization of Fluoropolymers, Macromolecules, Mar. 13, 2001, pp. 1533-1535, vol. 34 No. 6, American Chemical Society.

Pareta et al., A novel method for the preparation of starch films and coatings, Carbohydrate Polymers, Nov. 14, 2005, pp. 425-431, vol. 63, Elsevier.

Kumar et al., Experimental Observations on the Scaling of Adsorption Isotherms for Nonionic Surfactants at a Hydrophobic Solid-Water Interface, Langmuir, Apr. 28, 2004, pp. 4446-4451, vol. 20.

(Continued)

*Primary Examiner* — Thao X Le
*Assistant Examiner* — William F Kraig

(57) ABSTRACT

A layer to enhance nucleation of a substrate is described, including a method to form the layer, the method including obtaining a substrate comprising a patterned feature comprising a dielectric region and a conductive region, selectively forming a self-aligned monolayer (SAM) on the dielectric region of the substrate to enhance nucleation process of a first precursor, and depositing the first precursor on the substrate, the precursor to adsorb on the SAM.

14 Claims, 10 Drawing Sheets

OTHER PUBLICATIONS

Tanaka et al., Adsorption of Cationic Polyacrylamides onto Monodisperse Polystyrene Latices and Cellulose Fiber: Effect of Molecular Weight and Charge Density of Cationic Polyacrylamides, Journal of Colloid and Interface Science, Jan. 1990, pp. 219-228, vol. 134 No. 1.

Kozlov et al., Adsorption of Poly(vinyl alcohol) onto Hydrophobic Substrates, Macromolecules, Jul. 17, 2003, pp. 6054-6059, vol. 36, American Chemical Society.

Ramaraj, Crosslinked Poly(vinyl alcohol) and Starch Composite Films: Study of Their Physicomechanical, Thermal, and Swelling Properties, Journal of Applied Polymer Science, 2007, pp. 1127-1132, vol. 103, Wiley Periodicals.

Hollinshead et al., Neutron reflection from a dimyristoylphosphatidylcholine monolayer adsorbed on a hydrophobised silicon support, Biochemica et Biophysics Acta, 2001, pp. 49-59, vol. 1151.

Samu et al., Effect of Charge and Hydrophobicity on Adsorption of Modified Starches on Polyester, Journal of Colloid and Interface Science, 1999, pp. 260-268, vol. 220.

Thire et al., High resolution imaging of the microstructure of maize starch films, Carbohydrate Polymers, 2003, pp. 149-158, vol. 54.

Tiberg, Physical Characterization of non-ionic surfactant layers adsorbed at hydrophilic and hydrophobic solid surfaces by time-resolved ellipsometry, J. Chem. Soc., Faraday Trans., 1996, pp. 531-538, vol. 92(4).

Roos et al., Hydrophilic Monolayer Formation of Adsorbed Cationic Starch and Cationic Hydroxyethyl Cellulose Derivatives on Polyester Surfaces, Biosci. Biotechnol. Biochem., 2004, pp. 2247-2256, vol. 68(11).

Jansson et al., Influence on thickness of the mechanical properties for starch films, Carbohydrate Polymers, 2004, pp. 499-503, vol. 56.

Patrick et al., Self-Assembly Structures of Nonionic Surfactants at Graphite/Solution Interfaces, Langmuir, 1997, pp. 4349-4356, vol. 13, American Chemical Society.

Watanabe et al., Self-organization of polymer particles on hydrophobic solid substrates in aqueous media. I. Self-organization of cationic polymer particles on alkylated glass plates, Colloid Polym. Sci. 2006, pp. 305-315, vol. 285, Springer.

Serizawa et al., Stepwise Assembly of Ultrathin Poly(vinyl alcohol) Films on a Gold Substrate by Repetitive Adsorption/Drying Processes, Langmuir, 1999, pp. 5363-5368, vol. 15, American Chemical Society.

Siddaramaiah et al., Structure-Property Relation in Polyvinyl Alcohol/Starch Composites, Journal of Applied Polymer Science, 2004, pp. 630-635, vol. 91, Wiley Periodicals.

Rindlav-Westling et al., Surface Composition and Morphology of Starch, Amylose, and Amylopectin Flims, Biomacromolecules, 2003, pp. 166-172, vol. 4, American Chemical Society.

* cited by examiner

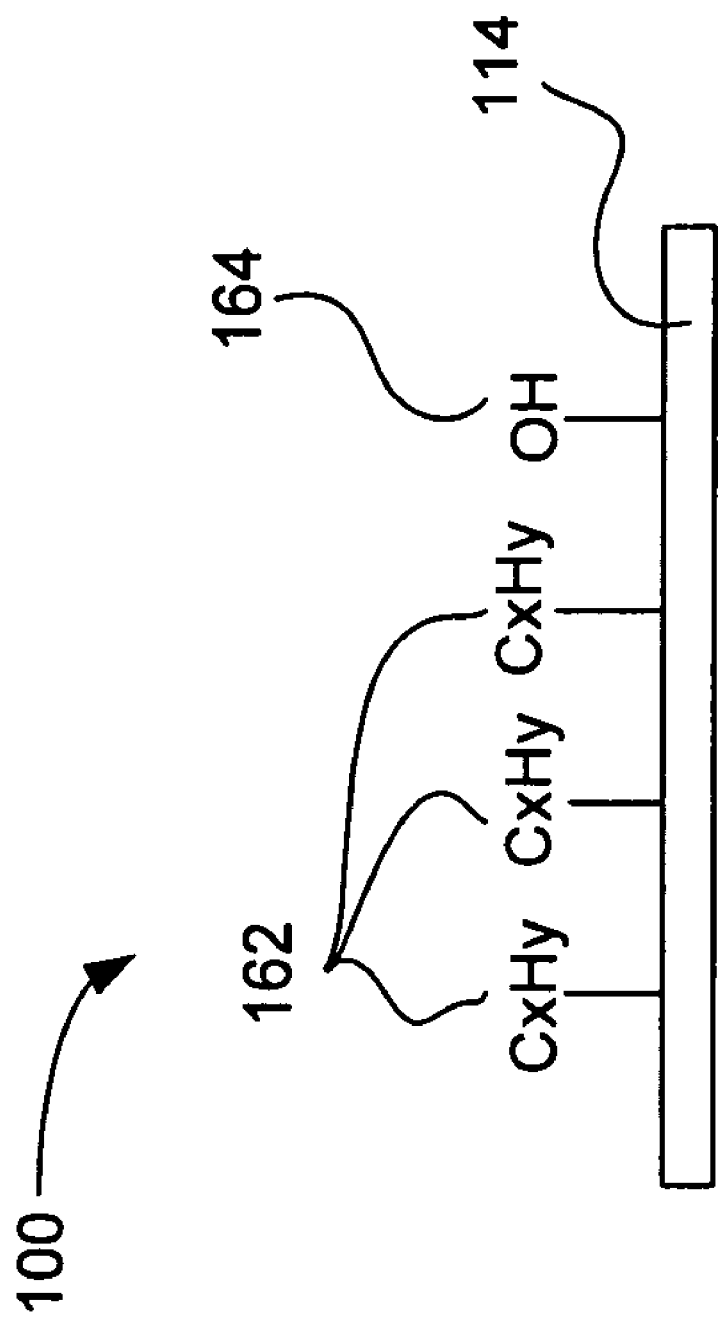

METHOD OF FORMING A LAYER TO ENHANCE ALD NUCLEATION ON A SUBSTRATE

CROSS-REFERENCE TO RELATED APPLICATIONS

This application claims the benefit of provisional patent application No. 60/938,431, filed May 16, 2007, which is hereby incorporated by reference herein in its entirety.

FIELD OF THE INVENTION

The present invention relates generally to semiconductor processing. More specifically, techniques for enhancing nucleation of a reaction at or on a substrate surface are described.

BACKGROUND OF THE INVENTION

Semiconductor devices may generally be formed by modifying silicon substrates using front end of the line (FEOL) processes and back end of the line (BEOL) processes. FEOL processes are used to form devices such as transistors using ion implantation and other techniques. BEOL techniques are used to create metallization that connects the various devices (e.g., the transistors) with each other and to external devices.

BEOL processing typically involves depositing conductive layers (e.g., interconnects) separated and insulated by dielectric materials. As semiconductor device sizes continue to shrink and device densities continue to increase, capacitance (both for resistive capacitive (RC) delay and power consumption) and cross-talk between interconnects becomes a greater concern. Silicon dioxide ($SiO_2$) has long been a primary dielectric used in BEOL processing; however, silicon dioxide has a dielectric constant, k=3.9, which is too high for many applications. As a result, low-k (e.g., k<3.0) and ultra low-k (e.g., k<2.5) dielectrics are now being used.

Moreover, shrinking device sizes and increased device densities has led to the use of copper for interconnects due to its high conductivity and improved electromigration resistance. However, copper can readily diffuse into dielectrics and react with silicon, of which may lead to device performance and reliability issues. As a result, barrier layers surrounding the copper used in metallization are deposited to protect materials adjacent to the copper.

Atomic layer deposition (ALD) is a process used to deposit conformal layers with atomic scale thickness control during various semiconductor processing operations. ALD may be used to deposit barrier layers, adhesion layers, seed layers, dielectric layers, conductive layers, etc. ALD is a multi-step self-limiting process that includes the use of at least two precursors or reagents. Generally, a first precursor (or reagent) is introduced into a processing chamber containing a substrate and adsorbs on the surface of the substrate. Excess first precursor is purged and/or pumped away. A second precursor (or reagent) is then introduced into the chamber and reacts with the adsorbed layer to form a deposited layer via a deposition reaction. The deposition reaction is self-limiting in that the reaction terminates once the initially adsorbed layer is consumed by the second precursor. Excess second precursor is purged and/or pumped away. The aforementioned steps constitute one deposition or ALD "cycle." The process is repeated to form the next layer, with the number of cycles determining the total deposited film thickness.

A major challenge is that ALD is surface sensitive. The quality of the deposited film and/or the ability to nucleate a reaction and/or the ability to deposit uniformly without pin holes across a variety of surfaces with and without topography/topology is largely dependent on the ability to form a uniform, adsorbed layer of the first precursor (or reagent) on the surface(s) of interest. Many ALD precursors readily adsorb (e.g., chemisorb) on hydroxyl (—OH) terminated surfaces such as silicon dioxide. However, low-k dielectric surfaces tend to be hydrophobic and as such have a much lower surface hydroxyl concentration. In contrast, these surfaces are generally terminated via hydrocarbon groups including but not limited to methyl (—$CH_3$) and ethyl (—$C_2H_5$) groups, which do not readily react with most ALD precursors, and therefore do not serve as good binding sites for such precursors. Additionally, many low-k dielectrics rely on film porosity as a means of further reducing the effective dielectric constant. These materials present additional challenges as the ALD precursor can penetrate more easily into such exposed pores and poison the dielectric material. Moreover, device structures such as damascene structures used in copper interconnects contain a variety of surfaces in conjunction with topography making uniform nucleation and subsequent growth of conformal, uniform, pin-hole free ALD film difficult.

Thus, what are needed are techniques for enhancing and improving ALD nucleation on a substrate.

BRIEF DESCRIPTION OF THE DRAWINGS

Various embodiments of the invention are disclosed in the following detailed description and the accompanying drawings:

FIG. 1B illustrates surface groups on a dielectric;

DETAILED DESCRIPTION

Figure 1A:
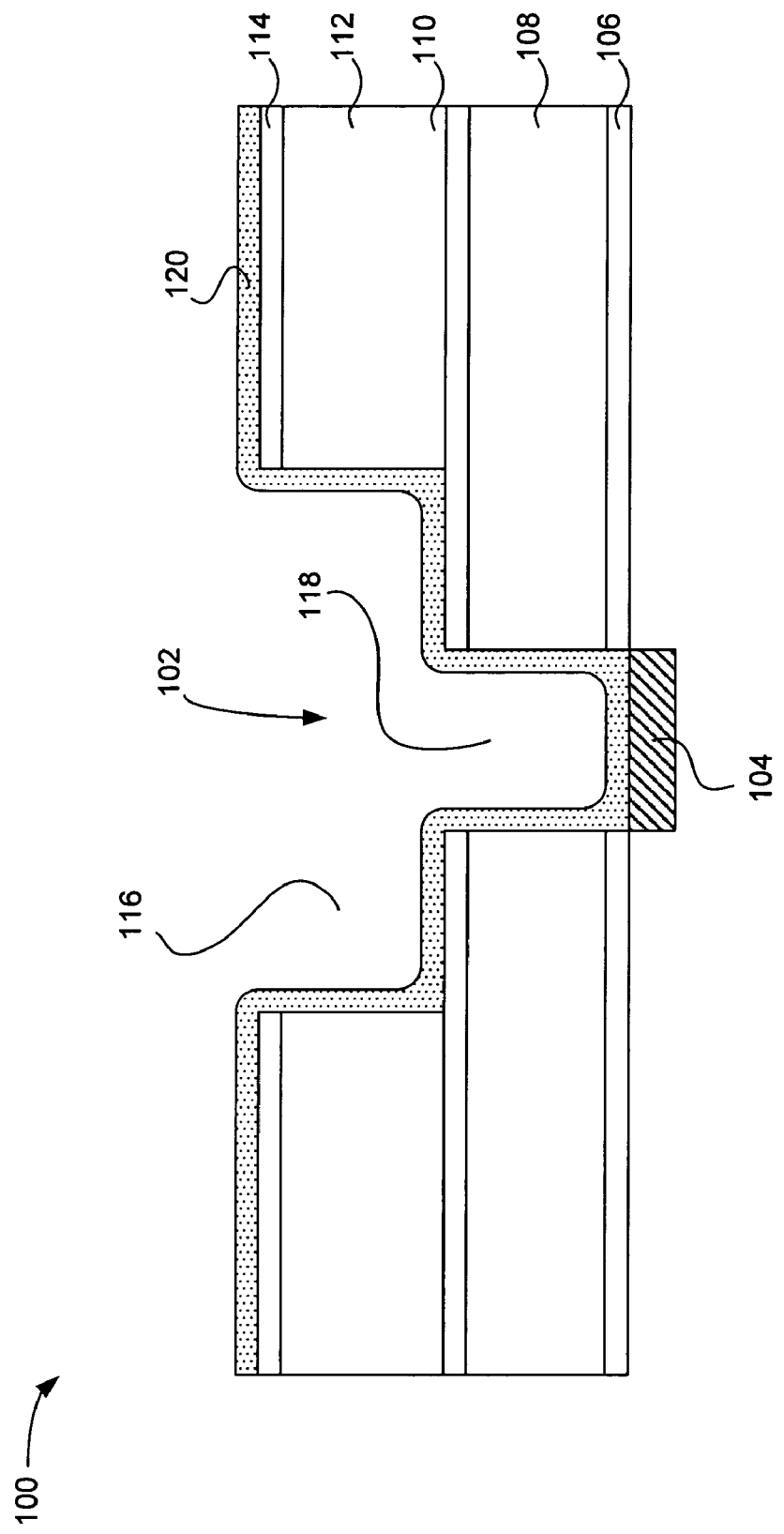
FIG. 1A illustrates a substrate including a damascene patterned feature according to an example.

Various embodiments of the invention may be implemented in numerous ways, including as a system, a process, or an apparatus. In general, operations of disclosed processes may be performed in an arbitrary order, unless otherwise provided in the claims.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, techniques for enhancing and improving ALD nucleation on a substrate are described. For example, the enhanced nucleation may be provided by a layer such as a self aligned monolayer (SAM) initially deposited over a substrate surface to change the type and availability of suitable surface reaction sites to improve and facilitate subsequent adsorption (for example, chemisorption) of a first atomic layer deposition (ALD) precursor to such modified surface(s). Chemisorption occurs when a precursor molecule adheres to a surface through the formation of a chemical bond (a strong bond) as compared to physisorption which occurs through weak Van der Waals forces. The SAM layer is used to change the effective surface termination of a substrate so that uniform chemisorption of a desired ALD precursor can occur more readily. The substrate may include a damascene patterned feature having a dielectric region and a conductive region, for example. A dielectric region may be any part of the substrate that includes a dielectric material, while a conductive region may be any part of the substrate that includes a conductive material (e.g., metal such as copper, aluminum, tungsten, etc.). The dielectric region may include one or more dielectrics, for example a low-k dielectric that includes hydrophobic surface groups (e.g., ethyl or methyl groups) which do not facilitate the chemisorption of many ALD precursors. In addition, the dielectric region may include more than one dielectric with differing types and availability of suitable reaction sites. For example, a damascene structure may comprise a tetraethyl orthosilicate (TEOS) dielectric (high hydroxyl surface concentration), a low-k silicon oxycarbide (SiCOH) dielectric (low hydroxyl/ high hydrocarbon surface concentration) and a porous ultra low-k SiCOH dielectric (low hydroxyl/high hydrocarbon surface concentration). Moreover, the type(s) and/or concentration(s) of the surface functional group(s) for the porous ultra low-k SiCOH may be different than the low-k SiCOH dielectric. Accordingly, it is difficult to form a uniformly chemisorbed layer simultaneously on such differing surfaces. As such, this makes it difficult to form a uniform (e.g. uniform thickness, morphology, grain structure, composition, etc.), conformal, pinhole free ALD film (e.g. barrier/adhesion layer) as each surface may exhibit different nucleation rates and/or incubation times.

In one embodiment, an intermediary self-aligned monolayer (SAM), such as a polyvinyl alcohol (PVA) or starch layer, may be selectively deposited over the dielectric regions of the substrate to improve chemisorption, for example of precursors, to the substrate. The term SAM may describe any layer that is deposited on a substrate by i) introducing a solution including a desired molecule, oligomer, and/or macromolecule, ii) allowing a layer to form, and iii) removing excess solution. The SAM normalizes and functionalizes the adsorption process of the ALD precursor on the dielectric regions of the substrate to facilitate uniform ALD nucleation and deposition. In some examples, ALD may be used to deposit a thin (e.g., 5-50 Å), conformal barrier layer for use with copper interconnects. Additionally, the SAM may be used to prevent ALD precursors from entering pores in the dielectric layers of the substrate.

Functionalizing a material as used herein refers to modifying the characteristics of an exposed part of the material to achieve a desired, uniform interaction with another material (or process) subsequently formed (performed) on the exposed part of the material. Normalization of the substrate through use of the SAM homogenizes regions or components of the substrate thereby ensuring uniform compatibility with subsequent processes. The SAM normalizes a substrate by conditioning at least a portion of the substrate so that subsequent processing (e.g., ALD) can proceed without consideration to the constituents of the substrate.

Patterned Substrate Including ALD Deposited Barrier Layer

FIG. 1A illustrates a substrate 100 including a damascene patterned feature 102 according to an example. The damascene patterned feature 102, as shown, is a dual damascene structure. However, it is understood that any damascene or other type of metallization structure or patterned topographical feature may be used with these examples. The damascene patterned feature 102 may be formed to create an interconnect as part of a back end of the line (BEOL) process.

The damascene patterned feature 102 may be formed on the substrate 100. The substrate 100 may be, for example, a silicon substrate including semiconductor devices such as transistors, and may have other layers of metallization already formed thereon. For example, the substrate 100 may include an interconnect 104, which may be a conductive region such as copper, aluminum, or tungsten.

The substrate 100 includes several dielectric layers 106-114 (i.e., dielectric regions). The dielectric layers 106-114 may define a portion of a metallization structure, and may be of any thickness, such as between than 50-10000 Å. A first etch stop layer 106 is formed over the substrate 100 to allow for formation of the damascene patterned feature 102. The first etch stop layer 106 may be a silicon carbide (SiC) or silicon carbonitride (SiCN) layer, for example. The first etch stop layer 106 may be used when patterning the damascene patterned feature to prevent an etch process from removing material beneath the first etch stop layer 106.

A first interlayer dielectric (ILD) 108 may be deposited over the etch stop layer 106. An ILD may be a dielectric used to separate and insulate interconnects, for example. The first ILD 108 may be any dielectric material including low-dielectric constant (low-k) dielectrics such as SiCOH, porous SiCOH, or fluorosilicate glass (FSG). For example, the dielectric constant of the ILD 108 may be k<3.0 or k<2.5. A second etch stop layer 110 is deposited over the first dielectric layer 108, and may be, for example, an SiC or SiCN layer. According to some examples, the second etch stop layer 110 may be of the same material as the first etch stop layer 106.

A second ILD 112 is deposited over the second etch stop layer 110, and may be a SiCOH, porous SiCOH, FSG, or spin on low-k dielectric layer, for example. For example, the dielectric constant of the ILD 112 may be k<3.0 or k<2.5. A capping layer 114 may be SiC, SiCN, SiN, SiNO, SiO2, or any combination of these layers. The capping layer 114 can also be used as a hardmask and may be tailored for dual damascene etch integration or to facilitate subsequent chemical mechanical planarization (CMP), for example. The layer 114 may in some instances comprise a refractory metal or metal nitride such as Ta or TiN, respectively. The configuration of the layers 106-114 as shown here is an example. It is understood that various other configurations may be used. For example, the etch stop and/or capping/hardmask layers 110 or 114 may be excluded.

The damascene patterned feature 102 includes the trench 116 and the via 118. The trench 116 and a via 118 may be created using damascene techniques, for example by using photolithography and etch techniques, as described below regarding FIGS. 2A and 2B and operation 304 of FIG. 3A.

A barrier layer 120 may be deposited using atomic layer deposition (ALD). ALD is a cyclical deposition process with each cycle generally comprising the following four operations:

1. First precursor
2. Purge
3. Second precursor
4. Purge

The cycle (i.e., the four operations) may be repeated, as needed, to form a layer of a desired thickness. The more cycles that are completed, the thicker the barrier layer 120. Based on empirical knowledge, a number of cycles for forming a barrier layer 120 of desired thickness may be chosen. For example, as the dimensions of the patterned features such as the width and height of the via 118 and trench 116 shrink, the barrier layer 120 is preferably made thinner to not impact the effective interconnect resistance due to the increase in the barrier's relative volume as compared to the copper volume. Barrier layers typically have resistivities greater than 10 to 100× that of copper.

The SAM may help deposit a conformal, even barrier layer while preventing ALD precursors from entering the dielectric regions of the substrate. For example, when using low-k and/or porous low-k ILDs 108, the SAM prevents ALD precursors from entering pores, which prevents damage to the ILDs 108 and 112 and maintains their dielectric constant. Additionally, the barrier layer 120 has a more consistent thickness and the SAM prevents discontinuities in the barrier layer 120 due to poor nucleation. Finally, the SAM promotes even growth on different surfaces. For example, if the layers 106-114 use different materials, the SAM allows even growth over those varied materials.

As described above, the dielectric layers 106-114 may have different materials and therefore may provide different adsorption characteristics. Additionally, interfacial layers may form at the interfaces between the dielectric layers 106-114, providing further integration challenges. An SAM may be deposited over the dielectric layers 106-114 (see FIG. 2C, for example) to normalize the surfaces of the dielectric layers 106-114 and functionalize the dielectric layers 106-114 for a subsequent process such as ALD. Additionally, the SAM may prevent ALD precursors from entering pores of the dielectric layers, thereby maintaining the low dielectric constant of the dielectric layers in the case of porous low-k dielectrics.

The barrier layer 120 is conformal and in contact with each of the layers 106-114. As shown in FIG. 1B, the layers 106-114 may include hydrocarbons 162 such as methyl and ethyl groups, which are not reactive towards ALD precursors and therefore antithetical to uniform chemisorption and the formation of the barrier layer 120. Hydroxyl groups 164 may be reactive and receptive to the binding of ALD precursors. As a result, ALD precursors may adsorb (e.g., chemisorb) where a surface has a low contact angle (i.e., good wettability or is hydrophilic). The surfaces of low-k dielectrics, as deposited, tend to be hydrophobic and prevent ALD adsorption.

An intermediary layer between the barrier layer 120 and the dielectric layers 106-114, for example, a self-aligned monolayer (SAM) may be formed over the substrate 100 before depositing the barrier layer 120. The SAM may be a polyvinyl alcohol (PVA) or a starch, for example, and may be cross-linked during polymerization. PVA may have the chemical formula $(CH_2CHOH)_n$ or

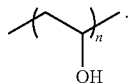

The starch may be any available starch, such as Perlcoat® 155 or Perlbond® 920 by Lyckeby Industrial AB of Kristianstad, Sweden. More details of various starch formulations are described below regarding FIGS. 5A-5D. Alternatively, any mixture of PVA and starch may also be used.

Generally, the SAM may be selectively formed over the dielectric regions of the substrate (i.e., the layers 106-114) to enhance nucleation and adsorption (e.g. chemisorption) of the ALD precursors to the substrate. The SAM may include reactive terminal groups such as hydroxyl (—OH) groups to react with the ALD precursors. For example, the SAM may be a PVA or a starch, which provide a physical layer having reactive hydroxyl groups that improve adsorption of precursors or reagents to the surface of the substrate 100. An optional annealing step can be added to improve the adhesion of the SAM layer to the dielectric while maintaining the hydrophilic (—OH) groups as the final surface. PVA and other SAMs may also seal the pores on the surface, so the SAM will prevent the penetration of precursors from the ALD processes into the dielectric bulk. The thickness of the PVA layer or other SAM may be chosen to not be so thick as to increase the effective dielectric constant of the low-k appreciably (<2% increase is desirable), but thick enough to effectively block precursor penetration into the bulk dielectric via the exposed pores in the case of porous dielectrics. Typically, the PVA layer or other SAM may be chosen to be less than or equal to approximately 50 angstroms, or less than or equal to 20 angstroms, depending on the average pore size of the dielectric. Thicker films may be used with larger pore sizes, while thinner films may be used with smaller pore sizes.

Process for Barrier Layer Formation

Figure 2A:
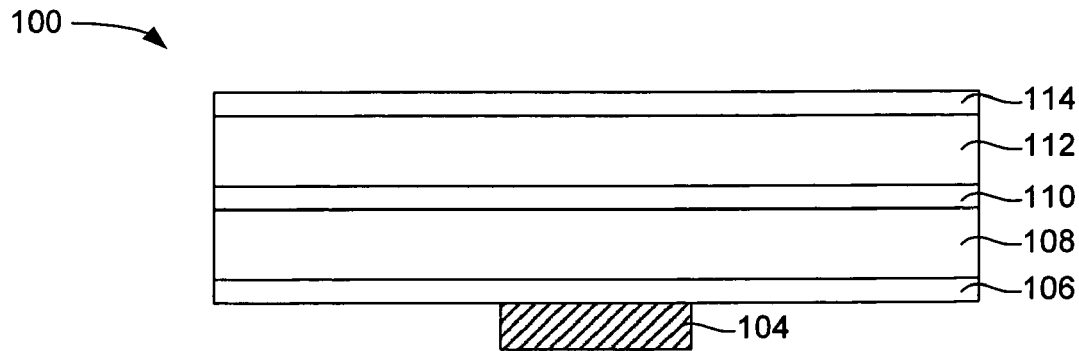
FIGS. 2A-2E illustrate a process for forming a barrier layer on a substrate using a self aligned monolayer (SAM) to enhance nucleation on the substrate.

FIGS. 2A-2E illustrate a process 300 for forming a barrier layer on the substrate 100 using an SAM to enhance ALD nucleation on the substrate 100. FIG. 3A is a flowchart describing the process 300.

In operation 302, the substrate 100 including dielectric and conductive regions is obtained. FIG. 2A illustrates the substrate 100 prior to patterning. The substrate 100 may include various layers of metallization and semiconductor devices, the interconnect 104 (e.g., a conductive region, such as copper, aluminum, or tungsten), and the several dielectric layers 106-114 (e.g., the dielectric regions).

Figure 2B:
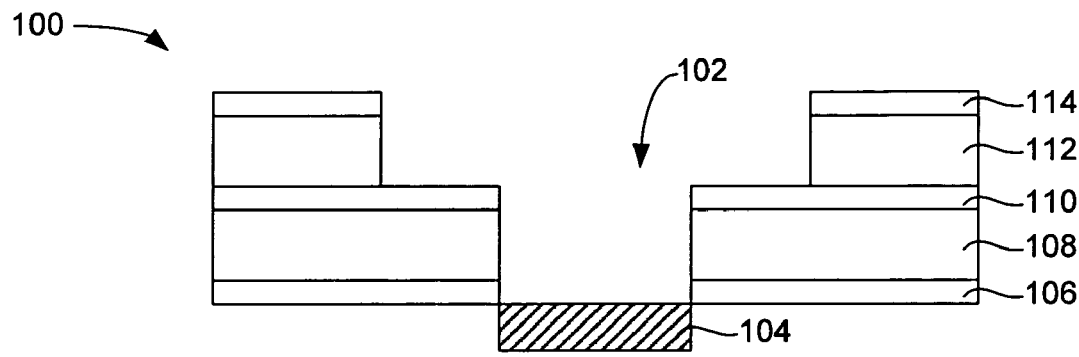
Figure 2C:
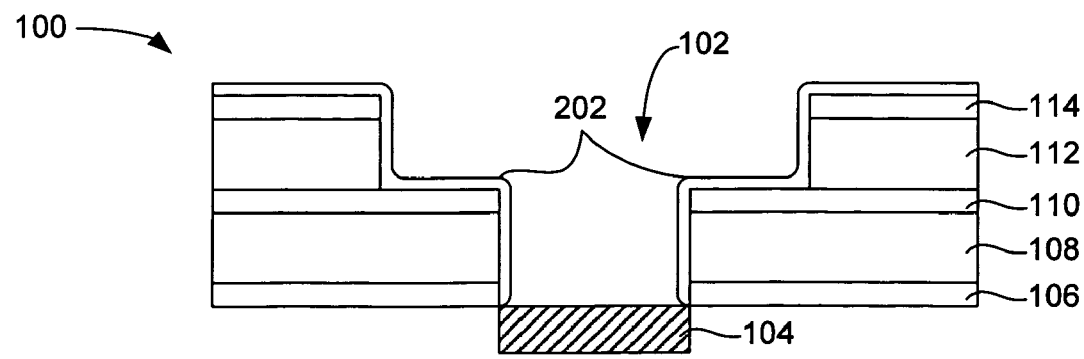
Figure 3A:
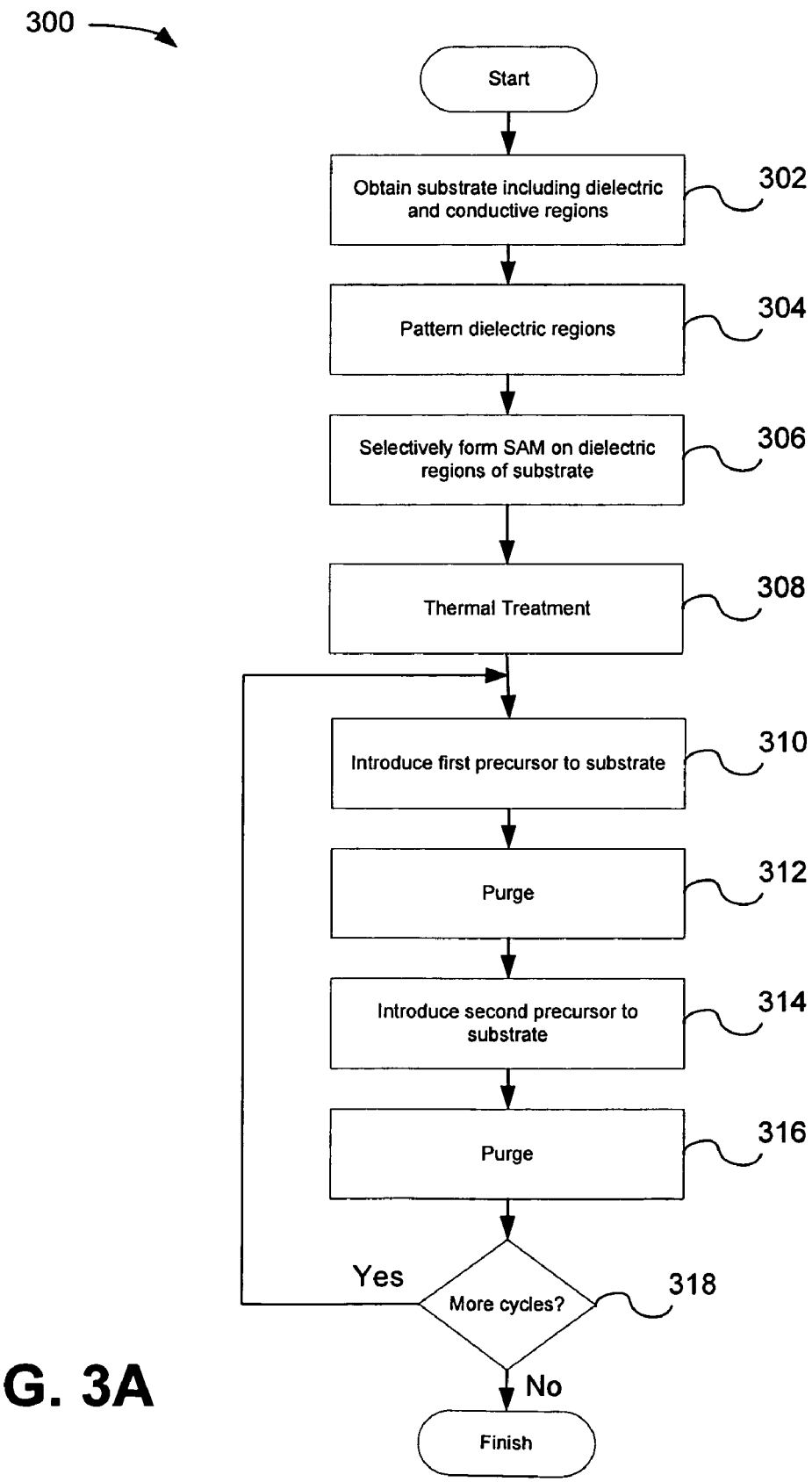
FIG. 3A is a flowchart describing a process for forming a barrier layer on a substrate using an SAM to enhance nucleation on the substrate.

In operation 304, and as shown in FIG. 2B, the dielectric regions of the substrate (e.g., the layers 106-114) are patterned. The example shown here may be a dual damascene patterned feature 102 formed using a trench-first/via-last, via-first/trench-last, or any other appropriate dual damascene patterning process may be used. Alternatively, the patterning may be single damascene or may use other processes to form any patterned feature. For example, using a via-first dual damascene process, the via 118 is first etched. The via 118 may be defined by depositing a layer of photoresist over the substrate 100. A portion of the layer of photoresist may be removed where the via 118 is to be opened, and the via 118 may then be etched using known techniques. After creating the via 118, another layer of photoresist may be deposited over the substrate 100 and the trench 116 may be defined. The trench 116 may then be etched to form the damascene patterned feature 102.

In operation 306, an SAM 202 is selectively formed on the dielectric regions of the substrate 100. The SAM 202 may be deposited after a wet post-via etch clean following the formation of the damascene patterned feature 102 in operation 304, for example. The SAM 202 may be, for example, a PVA layer, a starch layer, or a layer including a mixture of PVA and starch. With a PVA layer, the SAM 202 may be formed by introducing PVA solution to the substrate 100. PVA may be prepared by polymerizing vinyl acetate to create a polyvinyl acetate (PVAc). The PVAc may then be hydrolyzed, either partially or fully, to form PVA. If the PVA solution is partially hydrolyzed, the layer becomes a mixture of PVA and PVAc. The PVA solution may be prepared by heating PVA in water until dissolved and then allowing the solution to cool to room temperature. The PVA layer may be any thickness, for example between 5-100 Å or approximately 20 Å, and the entire film stack can be annealed to allow the PVA SAM layer to merge and integrate into the dielectric surface. Additionally, the PVA layer may be cross-linked using, for example, glutaraldehyde and sulfuric acid ($H_2SO_4$), dianhydride, citric acid or maleic acid as cross-linking agents. Cross-linking may further increase a hydrophilic characteristic and stability of the PVA layer and improve subsequent ALD chemisorption and hence nucleation.

According to another example, a starch may be used as the SAM 202. Any type of starch, such as a cationic starch or an oxidized, hydroxipropylated starch may be used. The starch may be, for example, Perlcoat® 155 and Perlbond® 920 by Lyckeby Industrial AB of Kristianstad, Sweden. The starch may be deposited in various concentrations, as described regarding FIGS. 5A-5D. Additionally, the SAM 202 may be a mixture of starch and PVA.

Figure 3B:
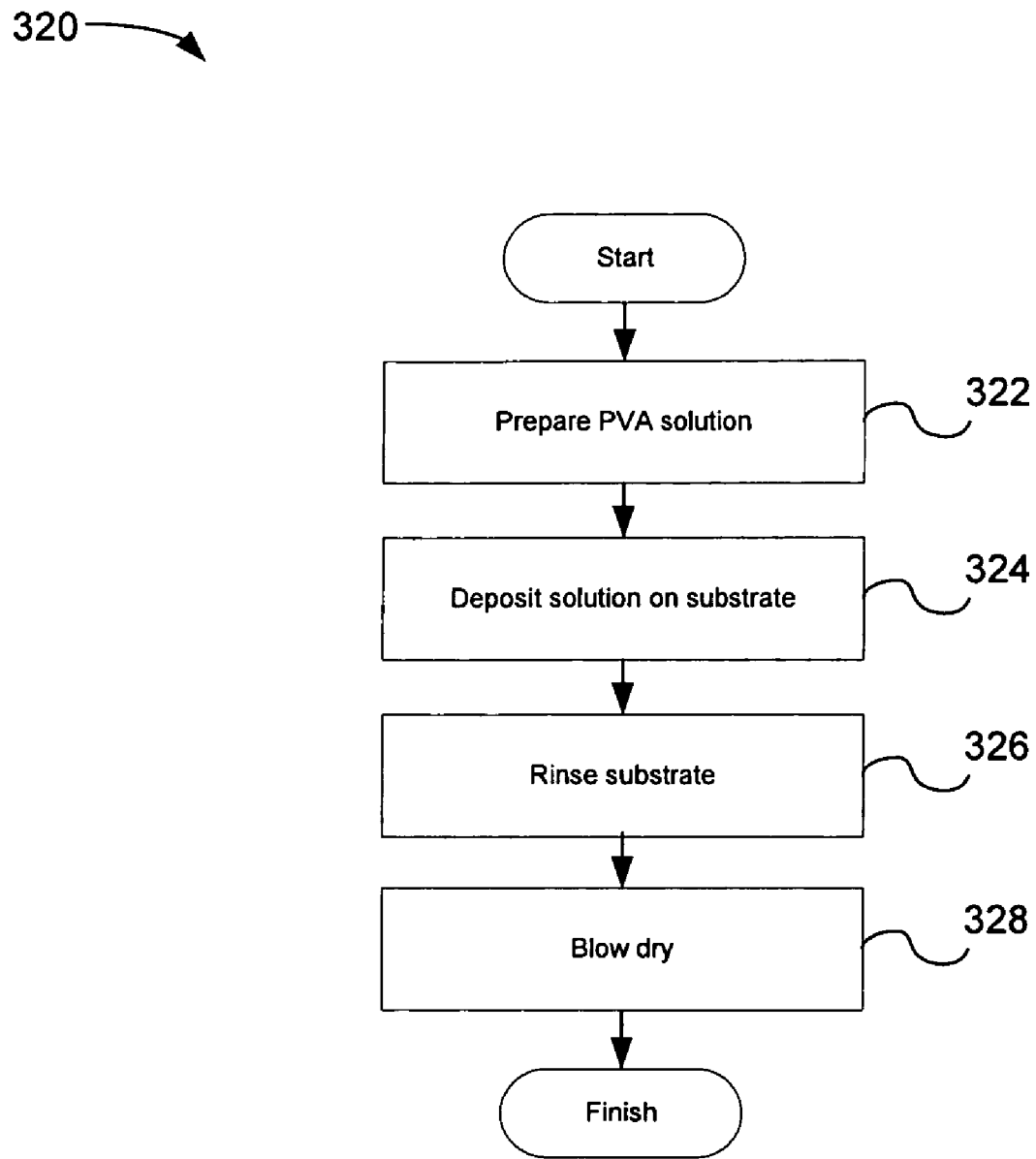
FIG. 3B is a flowchart describing a process for depositing a SAM on a substrate.

FIG. 3B is a flowchart describing a process 320 for depositing an SAM on a substrate. The process 320 is described in terms of a PVA layer, however, deposition of a starch layer or a layer of a mixture of PVA and starch may follow a similar process. In operation 322, a PVA solution is prepared. For example, the PVA solution may be 100 mM with respect to the monomer of vinyl alcohol. In operation 324, the solution is deposited on the substrate. For example, the solution may be deposited for 60 seconds at 25° Celsius. In operation 326, the substrate is rinsed to remove excess solution. For example, the substrate may be rinsed with water for 30 seconds. In operation 328, the substrate is blown dry, for example with nitrogen ($N_2$) gas.

In operation 308, an optional thermal anneal, such as a rapid thermal anneal (RTA), a furnace anneal, or a vacuum anneal may be performed. The thermal anneal may also be the degas step prior to the deposition of the barrier layer 120 in operations 310-318. The thermal anneal may be performed for example, in the range of 100-400° Celsius for a period between 30 to 180 seconds.

Figure 4:
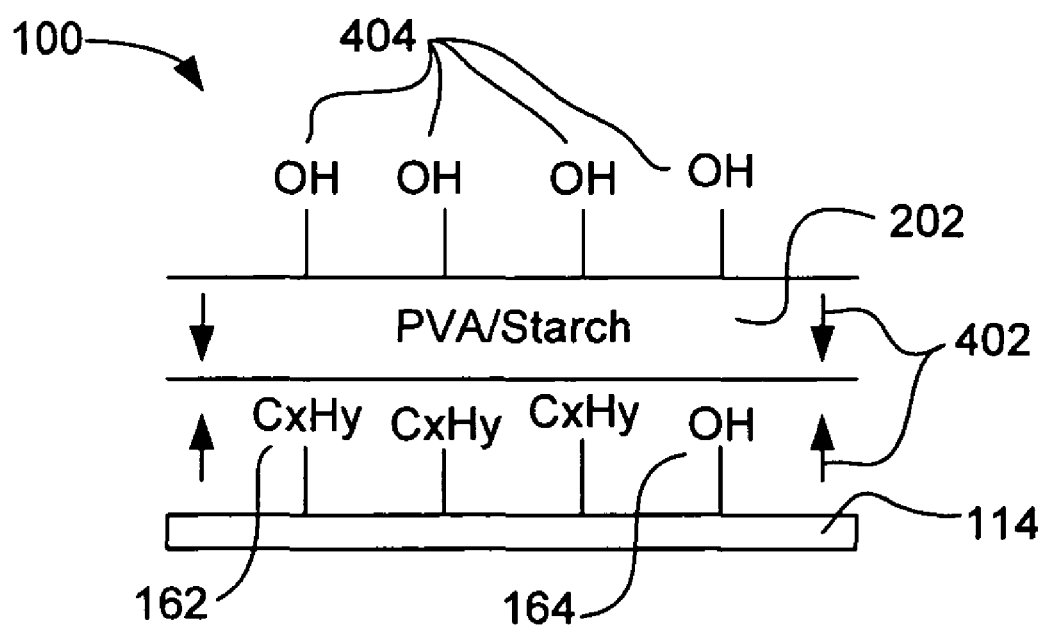
FIG. 4 illustrates the physical interaction of the SAM relative to the substrate according to an example.

The PVA layer and the starch layer are physical layers that do not chemically bond to the various dielectric layers 106-114. According to various examples, the PVA and starch layers physically adhere to hydrophobic surfaces (e.g., low-k dielectrics) while providing a hydrophilic surface. As a result, forming the SAM may change a hydrophobic characteristic of the substrate 100 to a hydrophilic characteristic of the substrate 100. The SAM 202 may therefore normalize and functionalize the dielectric layers 106-114 to uniformly enhance the adsorption of ALD precursors. FIG. 4 illustrates the physical interaction of the SAM relative to the substrate according to an example. As shown in FIG. 4, the layers 202 are physically 402 deposited over substrate 100, and hydroxyl groups 404 are available on the surface of the PVA or starch layer 202. Additionally, the SAM 202 is selectively deposited and does not adhere to the interconnect 104, or any other conductive region of the substrate 100.

The SAM 202 may also seal pores in the dielectric layers 106-114. For example, the ILDs 108 and 112 may be porous SiCOH or other dielectrics having pores. The SAM may include constituents that are able to seal those pores or passivate the surface without penetrating into the bulk, strengthening the structure and maintaining the low dielectric constant of the ILDs 108 and 112 by preventing other materials from entering the pores. For example, without the SAM 202, ALD precursors may penetrate into the bulk dielectric through exposed pores which may lead to an undesirable increase in the effective dielectric constant of the low-k material. The SAM 202 can prevent precursors from entering these pores and diffusing into the bulk.

Operations 310-316 describe an ALD cycle. The ALD cycle may be used to deposit a conformal ALD barrier layer, for example. The ALD cycle may be used with any ALD process, including thermal, plasma, ion-induced, and radical-enhanced ALD processes. As described above, as the number of cycles increases, the thickness of the barrier layer 120 also increases. The barrier layer 120 may be deposited on the SAM 202, and may, according to some examples, consume a portion or all of the SAM 202. Additionally, the barrier layer 120 may more strongly adhere to the substrate 100 because of the presence of the SAM 202. The barrier layer 120 also adheres to the interconnect 104 to form a continuous layer over the surface of the substrate 100. According to some examples, the ALD process may be performed in a vacuum environment at elevated temperatures. For example, the ALD may be performed at $10^{-3}$ to $10^2$ Torr and 100-500° Celsius. However, it is understood that ALD may be performed under any appropriate conditions.

In operation 310, a first precursor is introduced to the substrate. The first precursor may be any known ALD precursor. The first precursor may be chosen based on the material to be deposited as the barrier layer 120. For example, to deposit a titanium nitride (TiN) barrier layer, the first precursor may be tetrakis dimethylamino titanium (TDMAT) or other titanium precursors. Other examples of the first ALD precursor include tetrakis diethylamido titanium (TDEAT), pentakis (dimethylamido) tantalum (PDMAT), tris(diethylamino) (tert-butylimido) tantalum (TBTDET), tert-butylimino tris (ethylmethylamino) tantalum (TBTEMT), tetrakis (diethylamido) hafnium (TDEAHf), tetrakis (dimethylamido) hafnium (TDMAHf), tetrakis (ethylmethylamido) hafnium (TEMAHf), tetrakis (ethylmethylamido) silicon (TEMASi), ruthenocenes, bis (ethylcyclopentadienyl) ruthenium (Ru (EtCp)$_2$), bis (methylcyclopentadienyl) ruthenium (Ru (MeCp)$_2$), (2,4dimethylpentadienyl) (Ethylcyclopentadiently) ruthenium (Ru DER), 1,1-ethyl methyl ruthenocene (Ru(EtCp)(MeCp)), tungsten hexacarbonyl (W(CO)$_6$), and other organometallics.

Figure 2D:
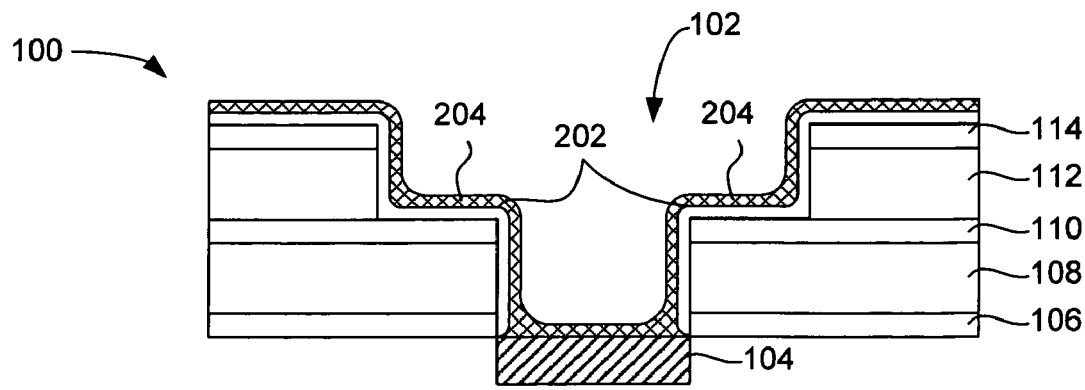

The first precursor may be introduced until the SAM 202 is saturated with the first precursor. For example, the hydroxyl groups on the SAM 202 may form bonds with the first precursor until substantially all of the hydroxyl groups are consumed via chemisorption of the ALD precursor. ALD is a self-limiting reaction; once the surface is saturated, any additional precursor does not attach to the surface. FIG. 2D illustrates a first precursor 204 attached to the SAM 202. In operation 312, the first precursor is purged. Any additional precursor that did not attach to the surface is removed, for example by purging the surface using nitrogen (or other suitable purge such as argon) gas and/or a vacuum pump to remove the excess precursor.

Figure 2E:
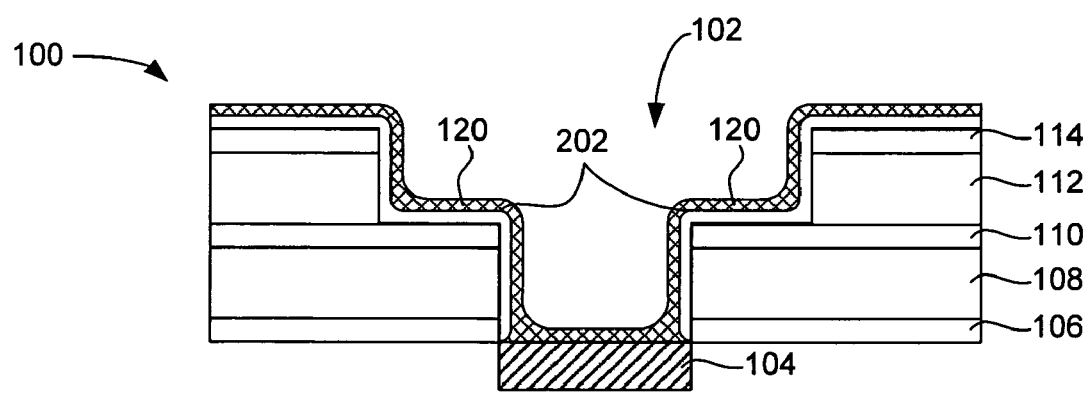

In operation 314, a second precursor is introduced to the substrate. The second precursor may be molecules, atoms, ions, radicals, and/or appropriate combinations thereof. For example, the second precursor can be ammonia (NH$_3$), hydrogen molecules, hydrogen atoms, hydrogen and/or argon ions, and/or hydrogen radicals, in the case of ALD TaN deposition using an organometallic tantalum-containing first precursor (e.g. pentakis (dimethylamido) tantalum (PDMAT), tris(diethylamino)(tert-butylimido) tantalum (TBTDET), tert-butylimino tris(ethylmethylamino) tantalum (TBTEMT), etc.). The second precursor reacts with the adsorbed first precursor, and forms the barrier layer 120, as shown in FIG. 2E. In operation 316, any excess of the second precursor is purged from the substrate, for example using a Ar or N$_2$ purge gas and/or a vacuum pump. As mentioned above, ALD is a self-limiting reaction; once the initially adsorbed first precursor has fully reacted with the second precursor, the reaction finishes. As a result, the barrier layer 120 is conformal and its thickness may be controlled by using a predetermined number of cycles.

In operation 318, it is determined whether to perform more cycles. As described above, additional cycles increase the thickness of the barrier layer 120. A predetermined number of cycles may be used to deposit a barrier layer having a desired thickness. If additional thickness is desired, and additional cycles are to be performed, the process 300 returns to operation 310. If no more cycles are to be performed, the process 300 finishes.

Figure 3C:
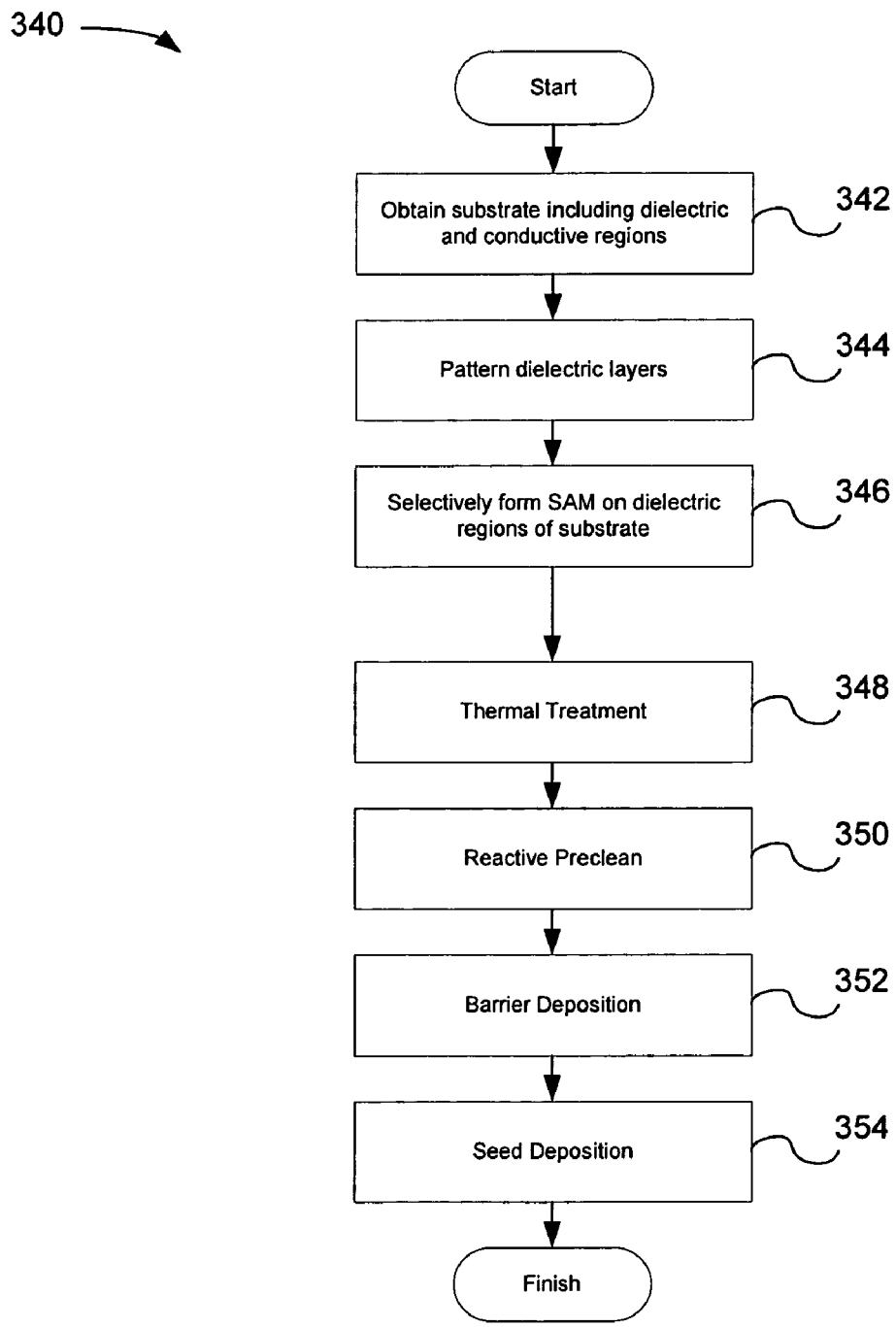
FIG. 3C is a flowchart describing a process for protecting a low-k dielectric during a reactive plasma clean using the SAM according to various examples

FIG. 3C is a flowchart describing a process 340 for protecting a low-k dielectric during a reactive plasma clean using the SAM 202 according to various examples. Operations 342-348 are similar in scope to operations 302-308, respectively, of the process 300. In operation 342, a substrate with dielectric and conductive regions is obtained. In operation 344, the dielectric layers are patterned. In operation 346, the SAM 202 is selectively formed on the dielectric regions, and in operation 348, the substrate is optionally thermally annealed.

In operation 350, a reactive plasma clean is performed. A reactive plasma may be used, for example, to remove organic contaminants, and/or reduce copper oxides prior to barrier deposition. The reactive plasma can damage low-k and porous low-k dielectrics, increasing the effective dielectric constant of the dielectrics. However, the SAM 202 protects the low-k dielectrics and protects the effective dielectric constant of the dielectrics. As a result, with the SAM 202, the substrate can be cleaned using reactive plasma without unwanted deleterious effects.

In operation 352, a barrier layer is deposited. For example, the barrier layer may be the barrier layer 120 that is deposited using the ALD process described above in operations 310-318, or using another deposition technique (e.g. physical vapor deposition (PVD), ionized PVD, chemical vapor deposition (CVD), etc.). In operation 354, a seed layer is optionally deposited to prepare for metal fill of a damascene structure. The seed layer may be, for example, copper or a copper alloy deposited using PVD, ionized PVD, CVD, or ALD. Further process operations may include metal fill (e.g. using electrochemical deposition) and planarization (e.g. using chemical mechanical planarization or electro-chemical mechanical planarization).

EXAMPLES

Described herein are two examples of SAMs that may be used to enhance ALD nucleation on a substrate. A PVA SAM and a starch SAM are described. However, it is understood that other SAMs capable of enhancing nucleation or improving adsorption (e.g. chemisorption) may also be used with the embodiments described herein, and that these examples are not limiting. Further, although specific concentrations and formulations are described, it is understood that various other configurations of the SAMs described below may be used.

Polyvinyl Alcohol

A first example deposited three samples each of four different PVA layers with a water deposition as a control. The first PVA layer was 89% hydrolyzed (i.e., 89% PVA and 11% PVAc) with a 13-23 kiloDalton (kDa) molecular mass, the second PVA layer was 99% hydrolyzed with a 13-23 kDa molecular mass, the third PVA layer was 99% hydrolyzed with a 31-50 kDa molecular mass, and the fourth PVA layer was 99% hydrolyzed with a 85-146 kDa molecular mass.

A PVA layer was deposited using the following process. The material (e.g., the water or PVA) is deposited for a predetermined amount of time. For example, the material may be deposited for 60 seconds. The layer is then rinsed for a predetermined amount of time, for example, 30 seconds. According to these examples, the layers were deposited at 25 degrees Celsius, with a total volume of one mL.

The layers were baked at 275° Celsius for 60 seconds at high vacuum (e.g., $10^{-7}$ Torr). The baking was used to simulate a high vacuum, high temperature ALD environment. The deposited layers were measured pre- and post-baking. For example, the thickness of the layers were measured using ellipsometry, and the contact angle of the surface was measured using a mercury probe.

The thickness measurements (in Angstroms) pre-baking are as follows:

|  | Water | PVA 89% 13-23 kDa | PVA 99% 13-23 kDa | PVA 99% 31-50 kDa | PVA 99% 85-146 kDa |
|---|---|---|---|---|---|
| Sample 1 | −17.1 | 25.7 | 12.6 | 11.7 | −6.2 |
| Sample 2 | 0.9 | 24.2 | 13.7 | 7 | 0.7 |
| Sample 3 | −15.4 | 29.7 | 2.5 | 19.5 | 0.8 |

Compared to the control (water), the pre-bake PVA layers show an increase in thickness, indicating that the PVA layer has been deposited.

The thickness measurements (in Angstroms) post-baking are as follows:

|  | Water | PVA 89% 13-23 kDa | PVA 99% 13-23 kDa | PVA 99% 31-50 kDa | PVA 99% 85-146 kDa |
|---|---|---|---|---|---|
| Sample 1 | −261.2 | −154.2 | −157.3 | −153.4 | −199.4 |
| Sample 2 | −111.7 | −93.8 | −157.2 | −215.5 | −127.8 |
| Sample 3 | −166.8 | −180.9 | −289.4 | −174.6 | −159.1 |

The post-bake thicknesses indicate probable shrinkage of underlying layers. However, contact angle measurements (below) indicate that the PVA layer remains intact.

Contact angle measurements were also taken pre- and post-baking. The pre-baking contact angle (in degrees) measurements are as follows:

|  | Water | PVA 89% 13-23 kDa | PVA 99% 13-23 kDa | PVA 99% 31-50 kDa | PVA 99% 85-146 kDa |
|---|---|---|---|---|---|
| Sample 1 | 86.8 | 45.5 | 41.3 | 40 | 54.6 |
| Sample 2 | 89.2 | 43.9 | 44.6 | 36.1 | 52.5 |
| Sample 3 | 93.1 | 47.9 | 42.4 | 34.9 | 53.4 |

All PVA layers show a substantial contact angle reduction (i.e., an increase in the hydrophilic nature of the substrate) compared to the control.

The post-baking contact angle measurements are as follows:

|  | Water | PVA 89% 13-23 kDa | PVA 99% 13-23 kDa | PVA 99% 31-50 kDa | PVA 99% 85-146 kDa |
|---|---|---|---|---|---|
| Sample 1 | 90.3 | 76.4 | 77.2 | 76.8 | 77.9 |
| Sample 2 | 92.1 | 79.7 | 86.9 | 76.4 | 73.6 |
| Sample 3 | 97.5 | 82.6 | 80.7 | 74.8 | 80.1 |

The PVA layers still show a consistent reduction in contact angle and therefore an increase in the hydrophilic nature of the substrate.

These results indicate that a PVA layer provides a more hydrophilic surface for ALD precursor adsorption. The PVA layer therefore normalizes the substrate and functionalizes the substrate for ALD.

Starch

According to various examples, a starch may also be used as an SAM to improve adsorption to a substrate. Two starches, Perlcoat® 155 and Perlbond® 920 by Lyckeby Industrial AB of Kristianstad, Sweden, were applied in varying concentrations to both low-k SiCOH type A (k ~3.0) and low-k SiCOH type B (k ~2.8) dielectric layers of a substrate. The Perlcoat® 155 starch was applied in 1% and 2% (by weight) concentrations, and the Perlbond® 920 was applied in 0.05% and 0.1% (by weight) concentrations. Perlcoat® 155 is an oxidized, hydroxipropylated starch, and Perlbond® 920 is a cationic starch ether.

The starches were deposited on SiCOH dielectric A for 180 seconds at 60° Celsius, and on a SiCOH dielectric B for 60 seconds at 60° Celsius. Thickness measurements were taken using an ellipsometer, and contact angle measurements were taken. Water deposition was used as a control.

Figure 5A:
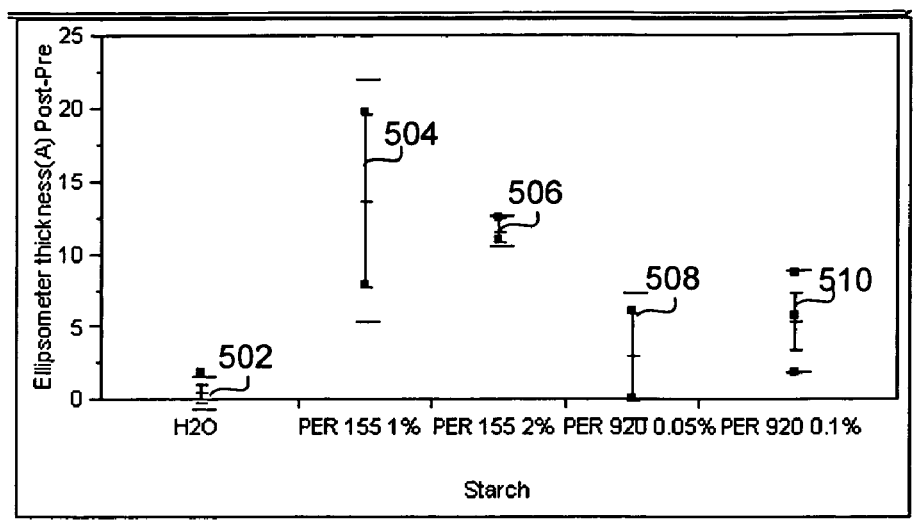
FIGS. 5A-5D illustrate graphs showing thickness measurements and contact angles for various starch layers.

FIGS. 5A-5D illustrate graphs showing thickness measurements and contact angles for various starch layers. Thickness measurements for the starch layers on the SiCOH dielectric A are shown in FIG. 5A. The graph 500 shows several plots describing the thickness (in Angstroms) of deposited layers on the substrate. The plot 502 shows very little change in thickness with water deposition (i.e., the control condition). The plot 504 shows an 8-20 Å layer resulting from the deposition of 1% Perlcoat® 155. The plot 506 shows a 10-12 Å layer resulting from the deposition of 2% Perlcoat® 155. The plot 508 shows a 0-7 Å layer resulting from the deposition of 0.05% Perlbond® 920. The plot 510 shows a 2-8 Å layer resulting from the deposition of 0.1% Perlbond® 920.

Figure 5B:
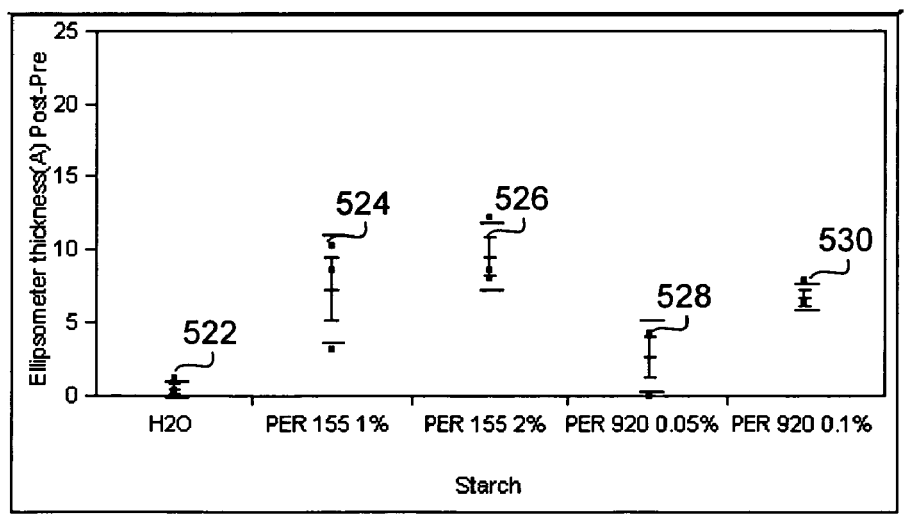

Thickness measurements for the starch layers on the SiCOH dielectric B are shown in FIG. 5B. As can be seen, all permutations of the starch layer show some degree of adhesion to the dielectric, while the control shows essentially no deposition. The graph 520 shows several plots describing the thickness (in Angstroms) of deposited layers on the substrate. The plot 522 shows very little change in thickness with water deposition (i.e., the control condition). The plot 524 shows an 3-11 Å layer resulting from the deposition of 1% Perlcoat® 155. The plot 526 shows a 7-11 Å layer resulting from the deposition of 2% Perlcoat® 155. The plot 528 shows a 0-6 Å layer resulting from the deposition of 0.05% Perlbond® 920. The plot 530 shows a 5-7 Å layer resulting from the deposition of 0.1% Perlbond® 920.

Figure 5C:
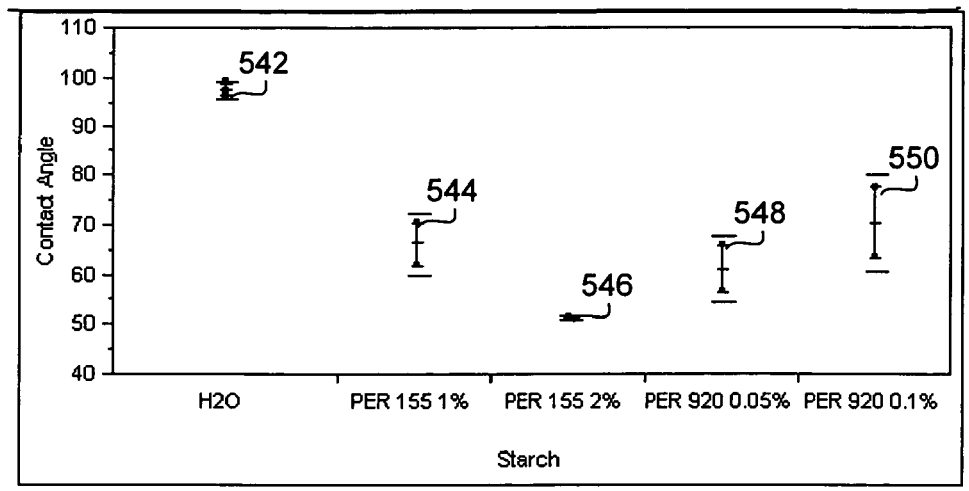
Figure 5D:
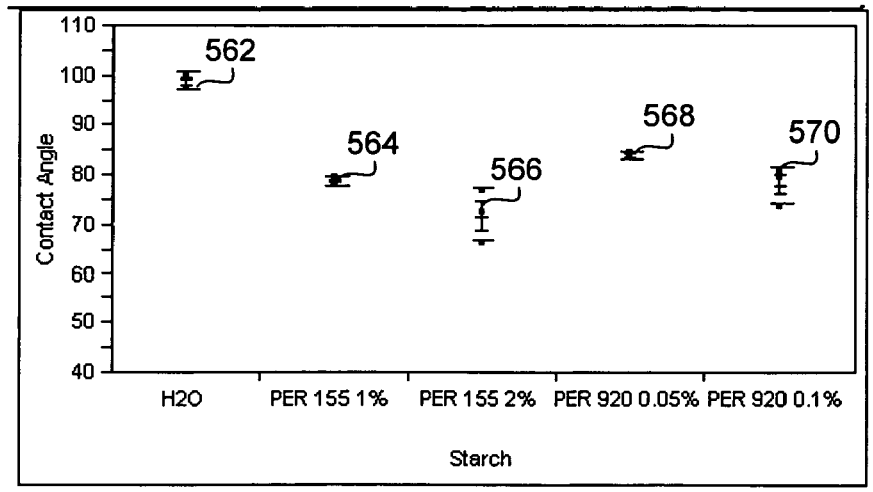

Contact angle measurements are shown in FIG. 5C for the starch layers on the SiCOH dielectric A layer and in FIG. 5D for the starch layers on the SiCOH dielectric B layer. As can be seen, a dielectric coated with starch exhibits significantly reduced contact angle compared to the control (water). For example, the dielectric layer having water deposited on it typically had a contact angle in the 95-100° range. The SiCOH A wafer exhibited a contact angle of between 50 and 80°, while the SiCOH B wafer had a contact angle of between 65 and 85°. A starch SAM can, therefore, be used to functionalize and normalize two differing dielectric surfaces to facilitate subsequent uniform chemisorption of an ALD precursor.

The graph 540 shows the contact angle for the various deposition conditions. The plot 542 shows that the contact angle for water deposition (the control) is 95-100°. The plot 544 shows that the contact angle with the 1% Perlcoat® 155 layer is 57-72°. The plot 546 shows that the contact angle with the 2% Perlcoat® 155 layer is approximately 50°. The plot 548 shows that the contact angle with the 0.05% Perlbond® 920 is approximately 50-65°. The plot 550 shows that the contact angle with the 0.1% Perlbond® 920 is approximately 55-75°.

Contact angle measurements are shown in FIG. 5D for the starch layers on the SiCOH dielectric B layer. The graph 560 shows the contact angle for the various deposition conditions. The plot 562 shows that the contact angle for water deposition (the control) is 95-100°. The plot 564 shows that the contact angle with the 1% Perlcoat® 155 layer is 75-80°. The plot 566 shows that the contact angle with the 2% Perlcoat® 155 layer is approximately 65-75°. The plot 568 shows that the contact angle with the 0.05% Perlbond® 920 is approximately 80°. The plot 570 shows that the contact angle with the 0.1% Perlbond® 920 is approximately 70-80°.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method, comprising:
   obtaining a substrate comprising a patterned feature, the patterned feature comprising a dielectric region and a conductive region;
   depositing a PVA solution having a concentration of between 20 and 500 mM with respect to monomer units on the substrate to selectively form a self-aligned monolayer (SAM) on the dielectric region of the substrate to enhance a nucleation process of a first precursor;
   introducing the first precursor to the substrate, the precursor to adsorb on the SAM.

2. The method of claim 1, further comprising introducing a second precursor on the substrate to react with the adsorbed first precursor to form a layer on the substrate.

3. The method of claim 1, wherein introducing the first precursor comprises introducing a first atomic layer deposition (ALD) precursor.

4. The method of claim 1, wherein depositing the PVA solution on the substrate changes a hydrophobic characteristic of the substrate to a hydrophilic characteristic of the substrate to functionalize the substrate for the adsorbing the first precursor.

5. The method of claim 1, wherein obtaining the substrate comprises obtaining the substrate comprising a damascene patterned feature.

6. The method of claim 1, wherein obtaining the substrate comprises:
   obtaining the substrate comprising a dual damascene patterned feature, wherein the dual damascene patterned feature comprises a first dielectric layer having a via and a second dielectric layer having a trench over the first dielectric layer.

7. The method of claim 6, wherein the first dielectric layer and the second dielectric layer are chosen from the group consisting of silicon dioxide, fluorosilicate glass (FSG), silicon oxycarbide (SiCOH), silicon nitride (SiN), silicon carbon nitride (SiCN), silicon carbide (SiC), low-k dielectrics and porous low-k dielectrics.

8. The method of claim 1, wherein the first precursor is an organometallic.

9. The method of claim 1, further comprising thermally treating the substrate after depositing the PVA solution and before introducing the first precursor.

10. A method comprising:
    obtaining a substrate comprising a dielectric region and a conductive region;
    patterning the dielectric regions of the substrate to form a patterned feature;
    depositing a PVA solution having a concentration of between 20 and 500 mM with respect to monomer units on the substrate to selectively form a self-aligned monolayer (SAM) on the dielectric regions of the substrate and the patterned feature; and
    performing a reactive pre-clean of the substrate.

11. The method of claim 10, wherein performing the reactive pre-clean comprises performing a reactive plasma clean.

12. The method of claim 10, wherein the SAM protects the dielectric region during the reactive pre-clean.

13. The method of claim 10, further comprising depositing a barrier layer on the substrate after the reactive pre-clean.

14. The method of claim 13, further comprising depositing a seed layer over the barrier layer.

* * * * *